United States Patent
Dudha et al.

(10) Patent No.: US 11,188,697 B1
(45) Date of Patent: Nov. 30, 2021

(54) ON-CHIP MEMORY ACCESS PATTERN DETECTION FOR POWER AND RESOURCE REDUCTION

(71) Applicant: Xilinx, Inc., San Jose, CA (US)

(72) Inventors: Chaithanya Dudha, San Jose, CA (US); Rajeev Patwari, Campbell, CA (US); Nithin Kumar Guggilla, Hyderabad (IN); Ashish Sirasao, San Jose, CA (US); Krishna Garlapati, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 17/141,983

(22) Filed: Jan. 5, 2021

(51) Int. Cl.
*G06F 30/333* (2020.01)
*G06F 30/343* (2020.01)
(Continued)

(52) U.S. Cl.
CPC .......... *G06F 30/333* (2020.01); *G06F 11/324* (2013.01); *G06F 30/3308* (2020.01); *G06F 30/343* (2020.01); *G11C 7/10* (2013.01); *G01R 31/28* (2013.01); *G06F 9/26* (2013.01); *G06F 9/34* (2013.01); *G06F 12/00* (2013.01); *G06F 13/00* (2013.01); *G06F 30/398* (2020.01); *G11B 7/00* (2013.01); *G11B 11/00* (2013.01);
(Continued)

(58) Field of Classification Search
CPC .. G06F 30/333; G06F 30/343; G06F 30/3308; G06F 30/398; G06F 11/324; G06F 9/26; G06F 9/34; G06F 13/00; G06F 12/00; G11C 7/10; G11C 29/04; G01R 31/28; G11B 27/36; G11B 11/00; G11B 7/00; H01L 21/00

USPC .......... 716/106, 104, 111, 118, 136; 703/16; 711/100, 111, 200, 211, 221; 714/6.1, 714/6.2, 30, 38.11, 39, 42, 763, 718, 730, 714/743; 365/201; 369/53.1; 326/16, 326/41, 47, 101
See application file for complete search history.

(56) References Cited

U.S. PATENT DOCUMENTS

| 6,384,627 B1 | 5/2002 | Fross et al. |
| 6,633,838 B1 | 10/2003 | Arimilli |

(Continued)

FOREIGN PATENT DOCUMENTS

| JP | 01106237 A | * | 4/1989 |
| JP | 02077853 A | * | 3/1990 |

OTHER PUBLICATIONS

Dai, Chinese Patent Document No. CN 111338864 A, published Jun. 26, 2020, abstract and 1 drawing. (Year: 2020).*

(Continued)

*Primary Examiner* — Phallaka Kik
(74) *Attorney, Agent, or Firm* — Kevin T. Cuenot (57) ABSTRACT

Determining on-chip memory access patterns can include modifying a circuit design to include a profiler circuit for a random-access memory (RAM) of the circuit design, wherein the profiler circuit is configured to monitor an address bus of the RAM, and modifying the circuit design to include a debug circuit connected to the profiler circuit. Usage data for the RAM can be generated by detecting, using the profiler circuit, addresses of the RAM accessed during a test of the circuit design, as implemented in an integrated circuit. The usage data for the RAM can be output using the debug circuit.

20 Claims, 7 Drawing Sheets

(51) Int. Cl.

| | |
|---|---|
| *G06F 30/3308* | (2020.01) |
| *G06F 30/398* | (2020.01) |
| *G06F 11/00* | (2006.01) |
| *G06F 9/34* | (2018.01) |
| *G06F 9/26* | (2006.01) |
| *G06F 13/00* | (2006.01) |
| *G01R 31/28* | (2006.01) |
| *G11C 7/10* | (2006.01) |
| *G11C 29/04* | (2006.01) |
| *G11B 27/36* | (2006.01) |
| *G11B 7/00* | (2006.01) |
| *G11B 11/00* | (2006.01) |
| *H01L 21/00* | (2006.01) |
| *G06F 11/32* | (2006.01) |
| *G06F 12/00* | (2006.01) |

(52) U.S. Cl.
CPC .............. *G11B 27/36* (2013.01); *G11C 29/04* (2013.01); *H01L 21/00* (2013.01)

(56) References Cited

U.S. PATENT DOCUMENTS

| | | | |
|---|---|---|---|
| 6,760,898 B1 | 7/2004 | Sanchez et al. | |
| 6,961,927 B1* | 11/2005 | Erb | ................... G06F 11/3476 |
| | | | 382/282 |
| 7,353,474 B1 | 4/2008 | Donlin | |
| 7,752,016 B2 | 7/2010 | Johnson | |
| 7,991,606 B1 | 8/2011 | D'Souza et al. | |
| 8,020,127 B1 | 9/2011 | Chan et al. | |
| 8,099,271 B2 | 1/2012 | Schubert | |
| 8,214,694 B1 | 7/2012 | McKechnie et al. | |
| 8,332,697 B1 | 12/2012 | Peattie | |
| 8,533,655 B1 | 9/2013 | Konduru | |
| 9,222,976 B1 | 12/2015 | Usgaonkar | |
| 9,495,492 B1 | 11/2016 | Ramabadran et al. | |
| 10,482,205 B2 | 11/2019 | Mahajan | |
| 10,627,444 B1 | 4/2020 | Peattie et al. | |
| 2001/0037477 A1 | 11/2001 | Veenstra | |
| 2002/0078264 A1 | 6/2002 | Eberhard | |
| 2003/0126490 A1 | 7/2003 | Litt et al. | |
| 2007/0112544 A1 | 5/2007 | Browen et al. | |
| 2007/0165482 A1* | 7/2007 | Asauchi | .................. G06F 21/79 |
| | | | 365/239 |
| 2008/0114971 A1* | 5/2008 | Fontenot | ............... G06F 9/3806 |
| | | | 712/227 |
| 2008/0126877 A1 | 5/2008 | Alsup | |
| 2009/0237110 A1 | 9/2009 | Lunzer et al. | |
| 2010/0162046 A1 | 6/2010 | Dervisoglu | |
| 2010/0332909 A1 | 12/2010 | Larson | |
| 2016/0011260 A1 | 1/2016 | Dervisoglu | |
| 2019/0005234 A1* | 1/2019 | Klonowski | .............. G06F 11/36 |
| 2019/0102500 A1* | 4/2019 | Sinclair | ................. G06F 8/4434 |

OTHER PUBLICATIONS

Xilinx, "Vivado Design Suite User Guide," UG908 (v2014.1). May 30, 2014, pp. 1-149, Xilinx, Inc., San Jose, California, USA. (Year: 2014).*

Dinigroup, "Successfully Debugging Complex FPGA Designs," Mar. 5, 2015, pp. 1-11, The Dini Group, La Jolla, California, USA.

Finchelstein, Daniel et al., "Debugging with ChipScope," MIT Class 6.111 Introduction to Digital Systems, Feb. 5, 2007, pp. 1-6, Massachusetts Institure of Technology, MTL Microsystems Technology Laboratores, Cambridge, Massachusetts, USA.

Xilinx, "Vivado Design Suite User Guide," UG908 {v2014.1), May 30, 2014, pp. 1-149, Xilinx, Inc., San Jose, California, USA.

Xilinx, "Integrated Logic Analyzer v5.0, LogiCORE IP Product Guide," PG172, Oct. 1, 2014, pp. 1-30, Xilinx, Inc., San Jose, California, USA.

U.S. Appl. No. 15/091,376, filed Apr. 5, 2016, Nand, Heera et aL, Xilinx, Inc., San Jose, CA USA.

* cited by examiner

```
RAM Utilization Analysis Report:
================================================================================
Instance Name                    |   Programmed   |   Unique address
                                 |   Depth        |   accessed
================================================================================
U0/memory_bank_0/zpm_ram_0       |   16384        |   4077
U0/memory_bank_0/xpm_ram_1       |   16384        |   15639
U1/ memory_bank_1 /xpm_ram_0     |   16384        |   7001
U1/memory_bank_2/xpm_ram_0       |   16384        |   1301
================================================================================

All RAMs:
================================================================================
Instance Name                    |   RAMS Used    |   RAMs needed
================================================================================
U0/memory_bank_0/xpm_ram_0       |   4            |   1
U0/memory_bank_0/xpm_ram_1       |   4            |   4
U1/memory_bank_1/zpm_ram_0       |   4            |   2
U1/memory_bank_2/xpm_ram_0       |   4            |   1
================================================================================
Total RAMs saved:      RAMs Used          RAMs needed
8 (50%)                16                 8
```

| Modify a circuit design to include a profiler circuit for a random-access memory (RAM) of the circuit design |
| :---: |
| 602 |

| Modify the circuit design to include a debug circuit connected to the profiler circuit |
| :---: |
| 604 |

| Generate usage data for the RAM by detecting, using the profiler circuit, addresses of the RAM accessed during a test of the circuit design, as implemented in an integrated circuit |
| :---: |
| 606 |

| Output, using the debug circuit, the usage data for the RAM. |
| :---: |
| 608 |

ON-CHIP MEMORY ACCESS PATTERN DETECTION FOR POWER AND RESOURCE REDUCTION

TECHNICAL FIELD

This disclosure relates to integrated circuits (ICs) and, more particularly, to the use of on-chip memories of an IC and detecting access patterns for the on-chip memories.

BACKGROUND

Electronic Design Automation refers to the use of computer-aided design techniques applied to the development of electronic systems such as integrated circuits (ICs). Modern EDA techniques utilize computer languages to describe the electronic system, e.g., digital circuitry, that is being developed. The computer languages used may be high-level programming languages such as C and/or C++, hardware description languages (HDLs) such as VHDL or Verilog, or other computer languages that are synthesizable. These modern computer languages support high-level programming abstractions suited to describe and/or test circuit designs. The high-level programming abstractions often reduce the amount of time needed by designers to develop circuit designs and facilitate design re-use. An example of design reuse is the reuse of cores, also referred to as Intellectual Properties or "IPs," across different circuit designs.

Often, cores have many different parameters that may be adjusted by the designer to tailor the core to a particular use case. The use case of the core refers to the particular circuit design in which the core is used and/or the particular IC in which the circuit design is to be implemented (e.g., the "target IC"). The ideal or preferred parameterization of a core will likely differ from one use case to another. Many designers are not aware of the implementation details of the cores used in their circuit designs. Efficient utilization of a core requires that the designer fine tune the core parameters. A suitable parameterization for the core can result in an implementation of the circuit design within target IC having improved timing, power consumption, and/or resource utilization. Without a deep working knowledge of the core itself and the use case, designers are unable to properly adapt the core to the application at hand resulting in an implementation of the circuit design having degraded timing, increased power consumption, and/or increased resource utilization on the target IC.

SUMMARY

In one aspect, a method can include modifying a circuit design to include a profiler circuit for a random-access memory (RAM) of the circuit design, wherein the profiler circuit is configured to monitor an address bus of the RAM, and modifying the circuit design to include a debug circuit connected to the profiler circuit. The method can include generating usage data for the RAM by detecting, using the profiler circuit, addresses of the RAM accessed during a test of the circuit design, as implemented in an integrated circuit (IC). The method also can include outputting, using the debug circuit, the usage data for the RAM.

In another aspect, an IC can include a RAM having an address bus and a profiler circuit coupled to the address bus of the RAM. The profiler circuit is configured to monitor the address bus and generate usage data for the RAM based on addresses detected on the address bus during a test of a circuit design including the RAM as implemented within the IC. The IC also can include a debug circuit coupled to the profiler circuit, wherein the debug circuit is configured to output the usage data for the RAM.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to the use of on-chip memories of an IC and detecting access patterns for the on-chip memories. Circuit designs often include one or more on-chip memories. Random-access memory (RAM) is one type of on-chip memory. On-chip RAM is often considered a critical or scarce resource when implementing a circuit design. Apart from the criticality and/or scarcity on the target IC, on-chip RAM may also consume a significant amount of power. For these reasons, efficient utilization of on-chip RAM is a significant concern when implementing a circuit design in a target IC.

In the usual case, on-chip memory is specified in a circuit design as a module of hardware description language (HDL). The memory module, in reference to the module of HDL, may include or instantiate a core (e.g., "Intellectual Property" or "IP"). The core may implement some or all of the memory module using one or more memory primitives of the target IC. The term "primitive" means a circuit block of a target IC that may not be subdivided. The primitive is treated as an atomic or unified element for purposes of technology mapping the circuit design and/or routing. The target IC may include a variety of different types of memory primitives that may be combined to form a single, larger memory defined by the memory module.

The memory module may be parameterized to specify a particular physical implementation of the memory module on the target IC. As an illustrative and non-limiting example, the memory module may be parameterized to specify a particular type of memory primitive and number of such memory primitives to be used to implement the on-chip memory on the target IC. As such, the memory module, including the parameterization thereof, dictates the size of the physical on-chip memory the memory module implements on the target IC.

In accordance with the inventive arrangements described within this disclosure, a circuit design may be instrumented to include additional circuitry that, when implemented in a target IC, is capable of performing runtime analysis of one or more on-chip memories of the circuit design. The additional circuitry is non-intrusive, capable of profiling usage of one or more on-chip memories of the circuit design, and capable of generating usage data for the one or more on-chip memories. With the usage data, the designer may refine the circuit design to reduce the amount of memory resources of the target IC needed to implement the circuit design and/or reduce the amount of power required by the circuit design.

In an example implementation, the circuit design may be modified to include a profiler circuit. The profiler circuit may be implemented in an efficient manner using few resources of the target IC. In an example implementation, the profiler circuit is coupled to an on-chip RAM of the circuit design. The circuit design may be further modified to include a debug circuit in communication with the profiler circuit. In one aspect, the profiler circuit is capable of monitoring operation, e.g., accesses, of the on-chip RAM during operation of the target IC with the circuit design implemented therein. The profiler circuit determines usage data for the on-chip RAM from the accesses to the on-chip RAM. The term "access," when used in reference to a memory, means a read and/or a write of the memory. The usage data may specify memory access patterns for the on-chip RAM. The debug circuit is capable of reading the usage data from the profiler circuit and outputting the usage data from the target IC.

In another example implementation, the usage data may be provided to a hardware manager. The hardware manager is capable of analyzing the usage data for the on-chip memory and generating a report. The report may include various aspects of the usage data. In one aspect, the analysis may include comparing the usage data to known features of the on-chip RAM and/or memory primitives used to implement the on-chip RAM. The report also may indicate particular refinements that may be applied to the on-chip RAM. The refinements may result in a reduction in the memory resources of the target IC needed to implement the on-chip RAM.

In another aspect, the profiler circuit may be configured to operate in one or more different modes. Each mode may capture different or more extensive usage data for the on-chip RAM. The different modes, when implemented by the profiler circuit, may also require differing amounts of circuit resources on the target IC.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
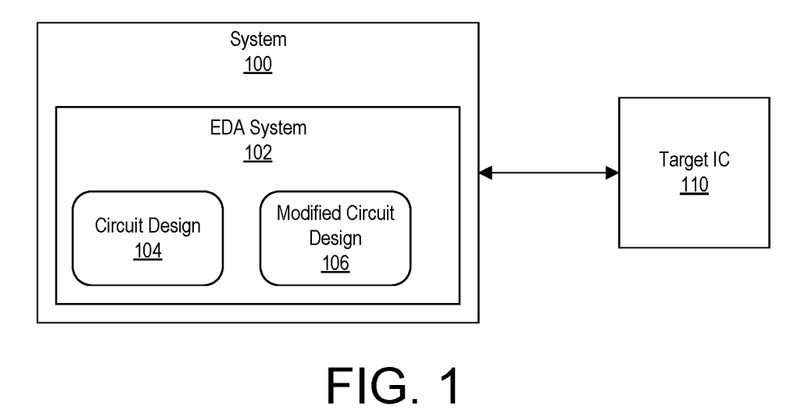
FIG. 1 illustrates an example of a system in accordance with the inventive arrangements described herein.

FIG. 1 illustrates an example of a system 100 in accordance with the inventive arrangements described herein. System 100 is configured to process a circuit design 104 for implementation in a target IC 110. In one aspect, system 100 may be implemented as a computer executing suitable software. An example hardware architecture for system 100 is described herein in connection with FIG. 7. An example architecture for target IC 110 is described herein in connection with FIG. 8. Electronic Design Automation (EDA) system 102 may be implemented in hardware, e.g., as dedicated circuitry; program code executed by one or more processors of system 100; or a combination thereof. EDA system 102 is capable of performing various operations described within this disclosure.

In the example of FIG. 1, system 100 is capable of operating on circuit design 104. System 100 modifies circuit design 104 to generate modified circuit design 106. In one example implementation, circuit design 104 is specified using a hardware description language (HDL). In another example implementation circuit design 104 is a netlist (e.g., has been synthesized). In any case, system 100 is capable of instrumenting circuit design 104 by inserting additional HDL specifying one or more profiler circuits and one or more debug circuits (or corresponding circuit structures in the case of a netlist) to create modified circuit design 106.

System 100 is capable of loading modified circuit design 106 into target IC 110. With modified circuit design 106 physically implemented in target IC 110, a test may be performed involving the implemented circuitry. During operation of target IC 110, e.g., during the test, the circuitry inserted into modified circuit design is capable of monitoring operation of one or more on-chip memories and, more particularly, one or more on-chip RAMs. The particular on-chip RAMs that are monitored may be selected at or around the time circuit design 104 is instrumented. The inserted circuitry is capable of generating usage data for the selected on-chip RAMs. Once the test is complete, the usage data may be read from the profiler circuit(s) and the debug circuit(s). For example, system 100 may read the usage data. In an example implementation, system 100 is capable of generating a report from the usage data and presenting the report. The report may be visually presented, e.g., displayed on a display of system 100, or rendered via another mechanism such as text-to-speech or the like.

Figure 2:
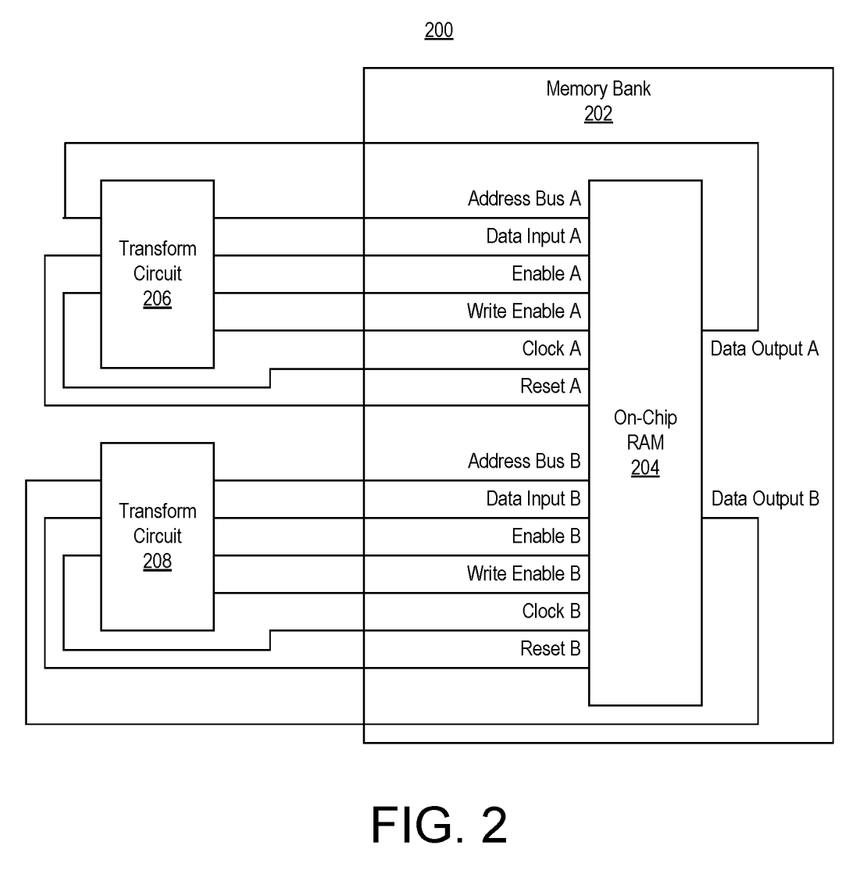
FIG. 2 illustrates an example of a circuit design prior to instrumentation.

FIG. 2 illustrates an example of a circuit design 200 prior to instrumentation. Circuit design 200 may be an example implementation of circuit design 104 of FIG. 1. In the example of FIG. 2, circuit design 200 includes a memory bank 202. Memory bank 202 includes an on-chip RAM 204. On-chip RAM 204 may include, or be formed of, one or more memory primitives of the target IC. Circuit design 200 includes two transform circuits 206, 208, each configured to perform various operations and access memory bank 202. In the example of FIG. 2, each of transform circuits 206, 208 may be derived from compute IPs included in circuit design 200.

In the example, on-chip RAM 204 is implemented as a dual-port memory having ports A and B. Accordingly, on-chip RAM 204 includes the following signals and/or buses for port A: an address bus for port A, a data input for port A, an enable for port A, a write enable for port A, a clock for port A, a reset for port A, and a data output for port A. On-chip RAM 204 includes the following signals and/or buses for port B: an address bus for port B, a data input for port B, an enable for port B, a write enable for port B, a clock for port B, a reset for port B, and a data output for port B.

For purposes of illustration, the write enable signal to each port indicates whether a write operation is performed or a read operation is performed. As an illustrative example, assertion of the write enable signal to a port indicates that a write operation is performed on the port. De-assertion of the write enable signal to the port indicates that a read operation is performed on the port. Assertion of the enable signal may be used to enable the port, whereby de-assertion of the enable signal renders the port inactive or placed in a low power mode.

The example provided is not intended to limit the inventive arrangements to a multiport memory. In this regard, it should be appreciated that the inventive arrangements described within this disclosure may be applied to single port memories. Further, the particular signals for a port of on-chip RAM 204 may vary based on the particular memory primitives used and/or the particular implementation of on-chip RAM 204 including the memory interface thereto.

For purposes of illustration, FIG. 2 depicts a simplified version of memory bank 202. In this regard, on-chip RAM 204 may include, or be coupled to, one or more other signals not shown in the example of FIG. 2.

Figure 3:
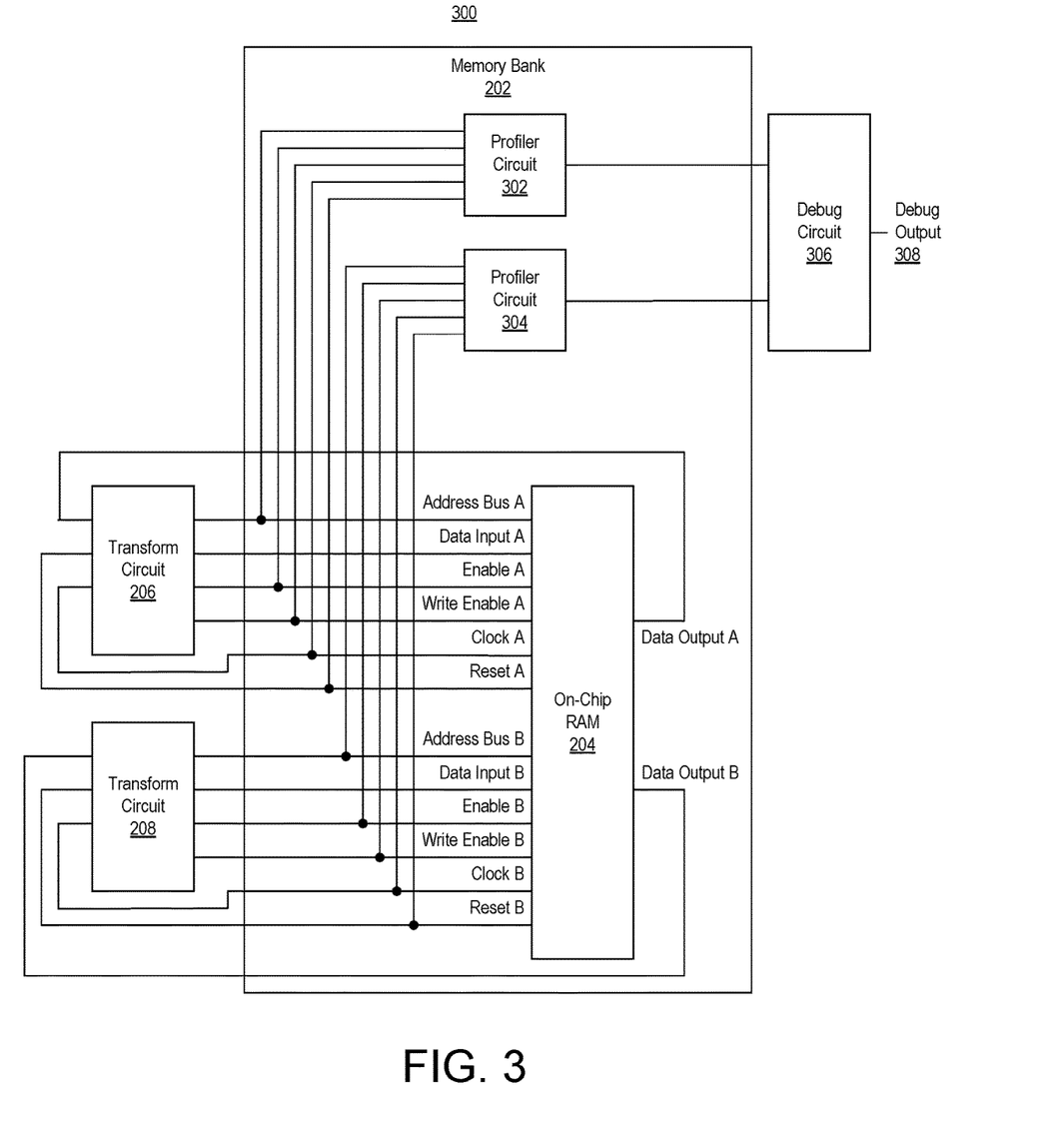
FIG. 3 illustrates an example circuit design subsequent to instrumentation.

FIG. 3 illustrates an example circuit design 300 subsequent to instrumentation. More particularly, circuit design 300 illustrates an example implementation of circuit design 200 subsequent to instrumentation. In this regard, circuit design 300 may be an example implementation of modified circuit design 106 of FIG. 1. In the example of FIG. 3, system 100 has instrumented circuit design 200 to include profiler circuits 302 and 304. System 100 has further instrumented circuit design 200 to include debug circuit 306.

In the example, each profiler circuit 302, 304 is associated with, and monitors, a particular port of on-chip RAM 204. For example, profiler circuit 302 is configured to monitor port A of on-chip RAM 204. Profiler circuit 304 is configured to monitor port B of on-chip RAM 204. In general, each port of an on-chip RAM may be monitored by one profiler circuit. Thus, in the case where on-chip RAM 204 is implemented as a single port memory, one profiler circuit would be needed.

As shown, profiler circuit 302 is connected to address bus A, to enable A, to write enable A, to clock A, and to reset A. Profiler circuit 304 is connected to address bus B, enable B, write enable B, to clock B, and to reset B. Each profiler circuit 302, 304 has an output that is connected to debug circuit 306. Debug circuit 306 is capable of generating debug output 308. In one example implementation, debug circuit 306 includes an output port that may be read by other devices and/or systems. For example, the output port may be implemented as a memory mapped output port. An example of a memory mapped output port is one compatible with the Advanced Microcontroller Bus Architecture (AMBA) eXtensible Interface (AXI) (hereafter "AXI") protocol. AXI defines an embedded microcontroller bus interface for use in establishing on-chip connections between compliant circuit blocks and/or systems.

AXI is provided as an illustrative example of a bus interface that may be used to establish on-chip connections and is not intended as a limitation of the examples described within this disclosure. It should be appreciated that other similar and/or equivalent protocols, communication buses, bus interfaces, and/or interconnects may be used in lieu of AXI and that the various example circuit blocks and/or signals provided within this disclosure will vary based on the particular protocol, communication bus, bus interface, and/or interconnect that is used.

Since each profiler circuit 302, 304 is associated with a port of a memory instance, the associativity of the profiler circuit can be mapped to the hierarchical instance name for the memory instance. Referring to the example of FIG. 3, profiler circuits 302 and 304 are inserted into memory bank 202 with on-chip RAM 204. In an example implementation, profiler circuits 302 and 304, e.g., the cores or IPs implementing the respective circuits, may be inserted into the same module of HDL as on-chip RAM 204.

A "core" refers to a pre-designed and reusable unit of logic, cell, or chip layout design in the field of electronic circuit design. A core, sometimes referred to as an "Intellectual Property (IP) Core" or "IP," is expressed as a data structure specifying a description of hardware that performs a particular function. A core may be expressed using HDL file(s), as a netlist, as a bitstream that programs a programmable IC, or the like. A core may be used as a building block within circuit designs adapted for implementation within an application-specific integrated circuit (ASIC), a programmable IC, e.g., an FPGA, system-on-chip (SoC), and/or other type of IC including a heterogeneous IC.

A core may include additional resources such as source code, high-level programming language models, schematics, documentation, and the like. Examples of different varieties of cores include, but are not limited to, digital signal processing (DSP) functions, memories, storage elements, math functions, etc. Some cores include an optimally floorplanned layout targeted to a specific family of ICs. Cores also may be parameterizable in that a user may enter parameters to activate or change certain functionality of a core.

During operation of circuit design 300 as implemented in target IC 110, profiler circuit 302 monitors addresses on address bus A while profiler circuit 304 monitors addresses on address bus B. Each profiler circuit 302, 304 is capable of generating usage data for on-chip RAM 204. Debug circuit 306 is capable of reading the usage data from each profiler circuit connected thereto. Debug circuit 306 is capable of providing the usage data to another device and/or system such as system 100 of FIG. 1 via debug output 308.

In one or more example implementations, profiler circuits 302, 304 may operate in one of a plurality of different modes. Each mode is capable of collecting a different type or set of usage data for on-chip RAM 204. In one example, each mode that is enabled may be implemented using a different architecture or implementation of profiler circuits 302, 304. As such, the particular signals of on-chip RAM 204 that are ultimately connected to profiler circuits 302, 304 may vary based on the particular mode that is activated and, as such, the particular circuit architecture in each respective profiler circuit. Accordingly, it should be appreciated that while particular connections between on-chip RAM 204 and profiler circuits 302, 304 are show in FIG. 3, the particular signals of on-chip RAM 204 that are connected to a profiler circuit may vary based on the type of usage data that is to be collected.

Figure 4A:
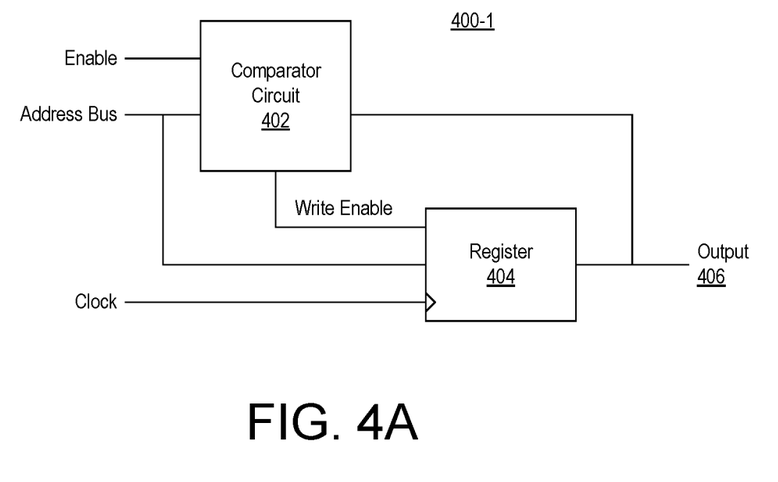
FIGS. 4A-4B illustrate example circuit architectures that may be used in varying combinations to implement a profiler circuit.
Figure 4B:
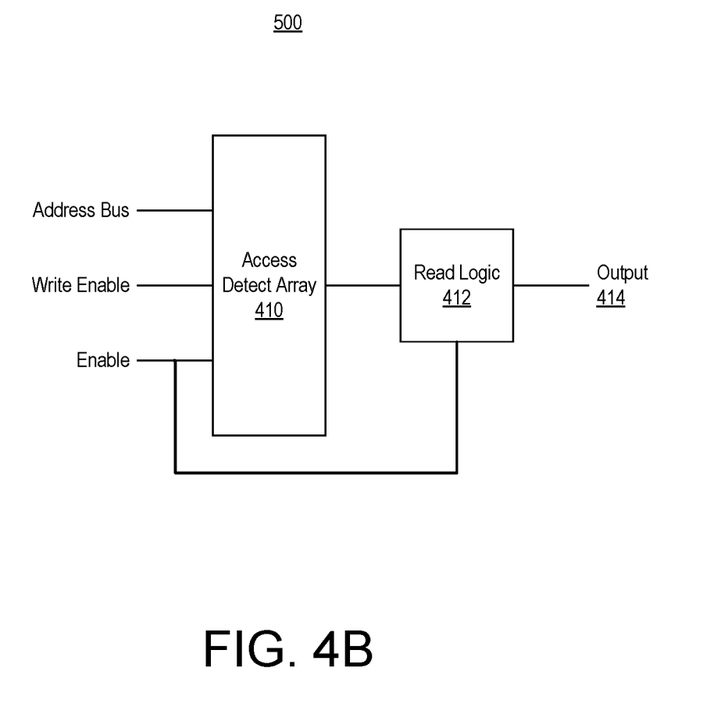

FIGS. 4A-4B illustrate example circuit architectures that may be used in varying combinations to implement a profiler circuit. FIG. 4A illustrates an example circuit architecture (architecture) 400-1 for inclusion in a profiler circuit. The example of FIG. 4A illustrates a circuit architecture 400-1 capable of implementing a first mode of operation for a profiler circuit. Architecture 400-1 includes a comparator circuit 402 and a register 404. Architecture 400-1 is capable of monitoring addresses that are provided on the address bus of the on-chip RAM being monitored. In an example implementation, architecture 400-1 is capable of monitoring addresses on the address bus for both read and write operations to the on-chip RAM. For example, architecture 400-1 may be included in each of profiler circuits 302 and 304 to monitor addresses on address bus A and on address bus B.

Architecture 400-1 is capable of detecting a maximum depth of an on-chip memory that is used or accessed during operation. The maximum depth may be output as usage data generated by architecture 400-1. Architecture 400-1 does so by detecting a largest address on the address bus for the on-chip RAM used or specified as part of a read operation or a write operation. For purposes of illustration, consider the case where architecture 400-1 is included in profiler circuit 302 and is coupled to port A of on-chip RAM 204. In the example of FIG. 4, comparator circuit 402 is connected to address bus A and to enable A. Register 404 is connected to address bus A and to clock A. Register 404 further receives a write enable signal from comparator circuit 402.

In operation, comparator circuit 402 receives an address on the address bus. Comparator circuit 402 may be operable in response to assertion of the enable signal. The address may be for a read operation or a write operation for on-chip RAM 204. Register 404 is capable of outputting the value stored therein via output signal 406. The value output on output signal 204 may be an initialized value upon startup or a previously stored address obtained from the address bus. Output signal 406 may be connected to the debug circuit and also fed back to comparator circuit 402.

Comparator circuit 402 compares the address from the address bus with the value from register 404. Initially, register 404 may be initialized to zero. In response to determining that the address received on the address bus exceeds the value stored in register 404, comparator circuit 402 is capable of asserting the write enable signal to register 404 so that the address received on the address bus may be stored in register 404 overwriting any previously stored value in register 404. As such, register 404 is capable of storing the largest address obtained from the address bus for the duration of the time that architecture 400-1 operates within the target IC. Register 404 will store the largest address either read or written for on-chip RAM 204 during the time architecture 400-1 operates.

FIG. 4B illustrates another example circuit architecture (architecture) 400-2 for inclusion in a profiler circuit. The example of FIG. 4B illustrates a second mode of operation for a profiler circuit and corresponding circuit architecture that is capable of determining sparsity information for an on-chip RAM. In an example implementation, as part of implementing the second mode of operation for the profiler circuit, architecture 400-2 may be included in a profiler circuit in combination with architecture 400-1 of FIG. 4A. While architecture 400-1 detects the highest or largest address of the on-chip RAM that is accessed, architecture 400-2 maintains a record of each address of the on-chip RAM that is accessed.

Architecture 400-2 includes an access detect array 410 and read logic 412. Architecture 400-2 is capable of monitoring addresses that are provided on the address bus of the on-chip RAM being monitored. Architecture 400-2 may be included in each of profiler circuits 302 and 304 to monitor addresses on address bus A and on address bus B.

Architecture 400-2 is capable of detecting sparsity information for the on-chip RAM during operation. The sparsity information may be output as usage data generated by architecture 400-2. Architecture 400-2 does so by detecting each address of the on-chip RAM that is read and written and setting a bit in access detect array 410 corresponding to each address. In the example, access detect array 410 is connected to the address bus, the write enable signal, and the enable signal of the port of on-chip RAM being monitored. Access detect array 410 may be implemented as a memory that has a width of 1-bit and a depth that is the same as the on-chip RAM being monitored. Accordingly, access detect array 410 includes one bit for each unique address of the on-chip RAM.

Read logic 412 is connected to access detect array 410 and to the enable signal. Read logic 412 is capable of generating a count (e.g., a sum) of the number of bits set in access detect array 410. Output signal 414 may be connected to the debug circuit. Read logic 412 is capable of outputting the count on output signal 414 to the debug circuit. In the second mode of operation, the profiler circuit is capable of providing a count of how many unique memory locations were accessed (read and written) in the on-chip RAM during a test using architecture 400-2 and the maximum depth/address of the on-chip RAM accessed by the circuit design during the test using architecture 400-1.

The second mode of operation may be used to indicate cases in which the circuit design uses only a subset of RAM locations having higher addresses. In such cases, the entire depth of the on-chip RAM is not necessary. For example, the maximum depth may be large while the count generated by read logic 412 indicates that only a small amount or fraction of the addresses of the on-chip RAM are actually accessed. The memory usage data, comprised of both the maximum address used and the sparsity data, may be presented as part of a report. A designer, for example, may use the report to refine the on-chip RAM implementation by, for example, using an address translation technique (e.g., circuitry) or other design technique where the size of the on-chip RAM is reduced in accordance with the number of unique addresses that were accessed.

Figure 5:
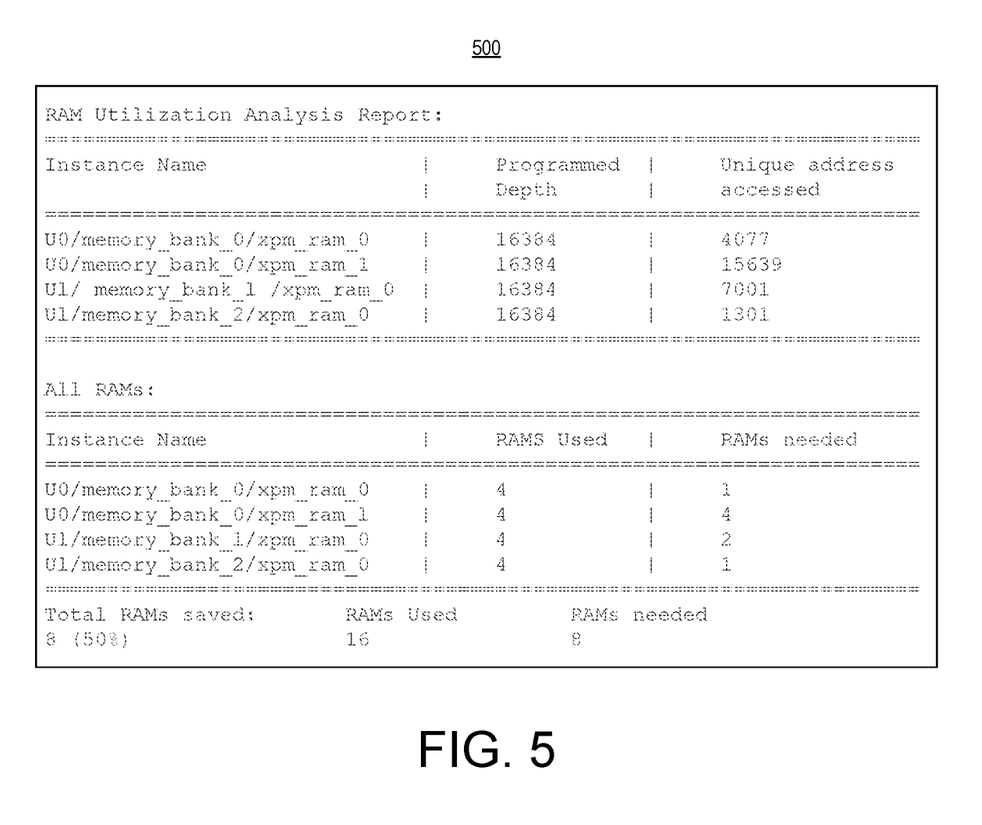
FIG. 5 illustrates an example report including usage data for an on-chip random-access memory (RAM).

FIG. 5 illustrates an example report 500 including usage data for an on-chip RAM. The usage data may be obtained using profiler circuits as described within this disclosure. The debug circuit is capable of outputting the usage data to a hardware manager. In an example implementation, the hardware manager may be a computer system such as system 100 of FIG. 1.

The hardware manager is capable of taking the usage data and generating report 500. The hardware manager may display report 500 on a display screen. For example, report 500 may be presented via a user interface such as a graphical user interface using the display screen. In the example of FIG. 5, the usage data indicates that the four instances of on-chip RAM each had a maximum address accessed of 16384. The usage data further indicates the number of unique addresses in each of the four on-chip RAMs that were accessed.

In one aspect, the hardware manager is programmed with information relating to the particular memory primitives available on the target IC and used to implement the particular on-chip RAM or RAM(s) for which usage data has been collected. The hardware manager is capable of automatically generating suggestions for improving resource utilization of the target IC. Referring to the example of FIG. 5, the hardware manager, having access to the circuit design and/or modified circuit design, is aware that each of the four on-chip RAMs is formed using a particular type of memory primitive available on the target IC. The hardware manager, being programmed with the size of each memory primitive and based on the usage data specifying the number of unique addresses accessed, generates an estimate of the number of the RAM memory primitives that are actually needed to implement each on-chip RAM. Appreciably, the number of unique addresses accessed indicates the amount of the RAM that was actually utilized during the test. Report 500 indicates savings in terms of the circuit resources that are needed to implement the user's circuit design.

Figure 6:
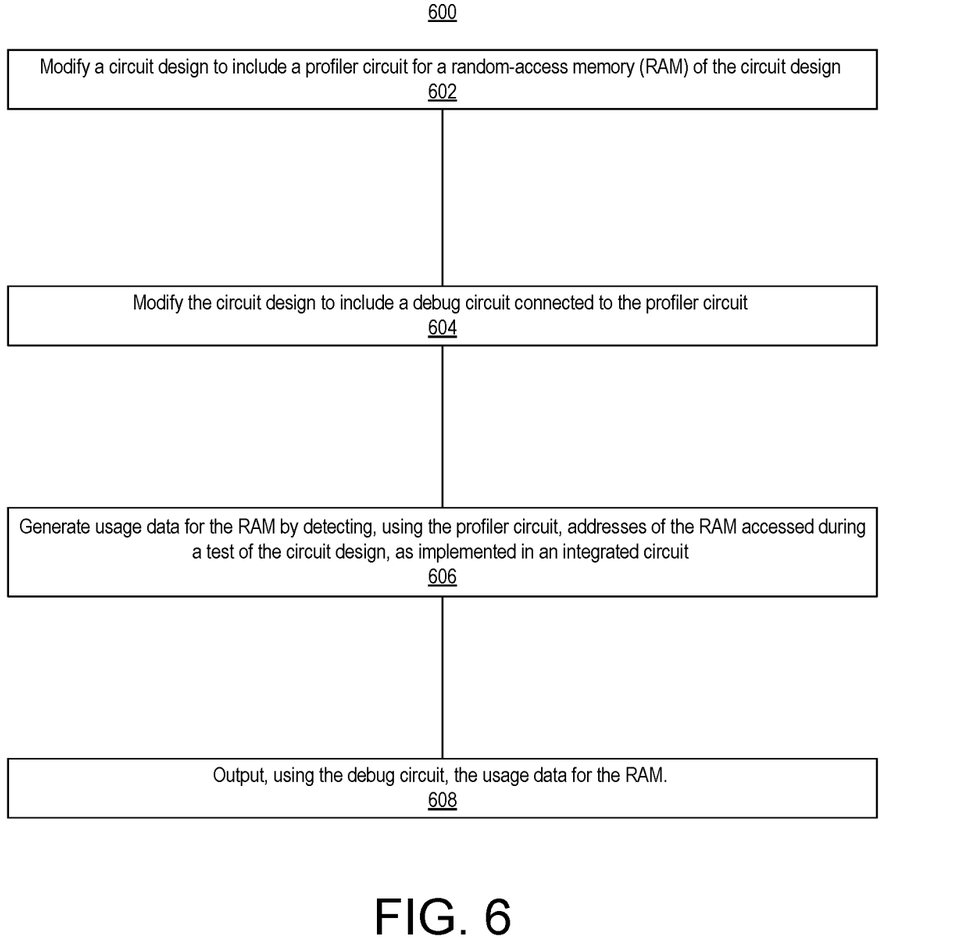
FIG. 6 illustrates an example method of detecting access patterns for an on-chip memory of an integrated circuit (IC).

FIG. 6 illustrates an example method 600 of on-chip memory access pattern detection. Method 600 may be performed using a system and target IC as described herein in connection with FIG. 1.

In block 602, the system is capable of modifying a circuit design to include a profiler circuit for a RAM of the circuit design. The RAM may be an on-chip RAM in that the RAM is implemented on the target IC as opposed to external thereto. The profiler circuit is configured to monitor an address bus of the RAM.

For example, a user may specify one or more on-chip RAMs of the circuit design that are to be monitored during a test. The user may provide an input, that is received by the system, where the input annotates or marks the on-chip RAMs within the circuit design that are to be monitored. In another example implementation, the system is capable of automatically detecting each on-chip RAM of the circuit design and presenting a list of such on-chip RAMs to the user. The user may then provide a user input that is received by the system, where the input selects which, if any, of the on-chip RAMs are to be monitored.

In response to an on-chip RAM being selected, the system is capable of inserting a profiler circuit for each port of a selected on-chip RAM. If the selected on-chip RAM is a single port memory, the system inserts one profiler circuit connected to the address port. If the selected on-chip RAM is a dual port memory, the system inserts one profiler circuit on each port of the on-chip RAM (e.g., two profiler circuits are inserted).

In another aspect, in choosing a particular on-chip RAM to be monitored, the user may also specify a particular mode of operation for the profiler circuit by way of providing a user input to the system. The system inserts the particular circuit structures necessary for the profiler circuit to implement the mode of operation selected by the user. For example, the system may include circuitry as described in connection with FIG. 4A or circuitry as described in connection with both FIGS. 4A and 4B into the circuit design as the profiler circuit. In the case where more than one profiler circuit is inserted into the circuit design, the operating mode of each profiler circuit, and as such the architecture thereof, may be specified by the user on an individual basis. Thus, each profile circuit may implement a particular mode specific to that profiler circuit and port of the on-chip memory being monitored.

In block 604, the system is capable of modifying the circuit design to include a debug circuit connected to the profiler circuit. The debug circuit is connected to the output of the profiler circuit. As noted, more than one profiler circuit may be connected to a single debug circuit.

In block 606, the profiler circuit is capable of generating usage data for the RAM by detecting addresses of the RAM accessed (e.g., read and written) during a test of the circuit design, as implemented in an IC (e.g., the target IC). For example, having instrumented the circuit design to generate the modified circuit design, a placed and routed version of the modified circuit design may be loaded or implemented in the target IC. The profiler circuit may be initialized. The circuit design, as implemented in the target IC, may undergo a test. The test may exercise portions of the circuit design that access the memories that have been instrumented with profiler circuits. The profiler circuits may operate as described for the duration of the test.

In block 608, the debug circuit of the circuit design, as implemented in the IC, is capable of outputting the usage data for the RAM. For example, once the test completes, the hardware manager may read the usage data collected by the profiler circuit(s) from the debug circuit. That is, the system may instruct the debug circuit to read the usage data from the various profiler circuit(s). The debug circuit may include a memory mapped interface that allows the hardware manager to provide instructions as described and further to read the usage data received from the various profiler circuit(s).

In one or more example implementations, the debug circuit is not constrained to use the same clock frequency of the circuit design or the circuit components being monitored (e.g., the on-chip RAM(s)). That is, since data is accumulated using a lightweight circuit architecture and read once the test is complete, the debug circuit need not be clocked at the same speed as the circuit structures being monitored. In addition, since each profiler circuit is associated with a port of a memory instance, the associativity of the profiler circuit (and data generated by the profiler circuit) can be mapped to the hierarchical instance name of the memory. This allows the usage data generated to be mapped or attributed to the particular on-chip memory being monitored and indicated in the report(s) that may be generated.

Figure 7:
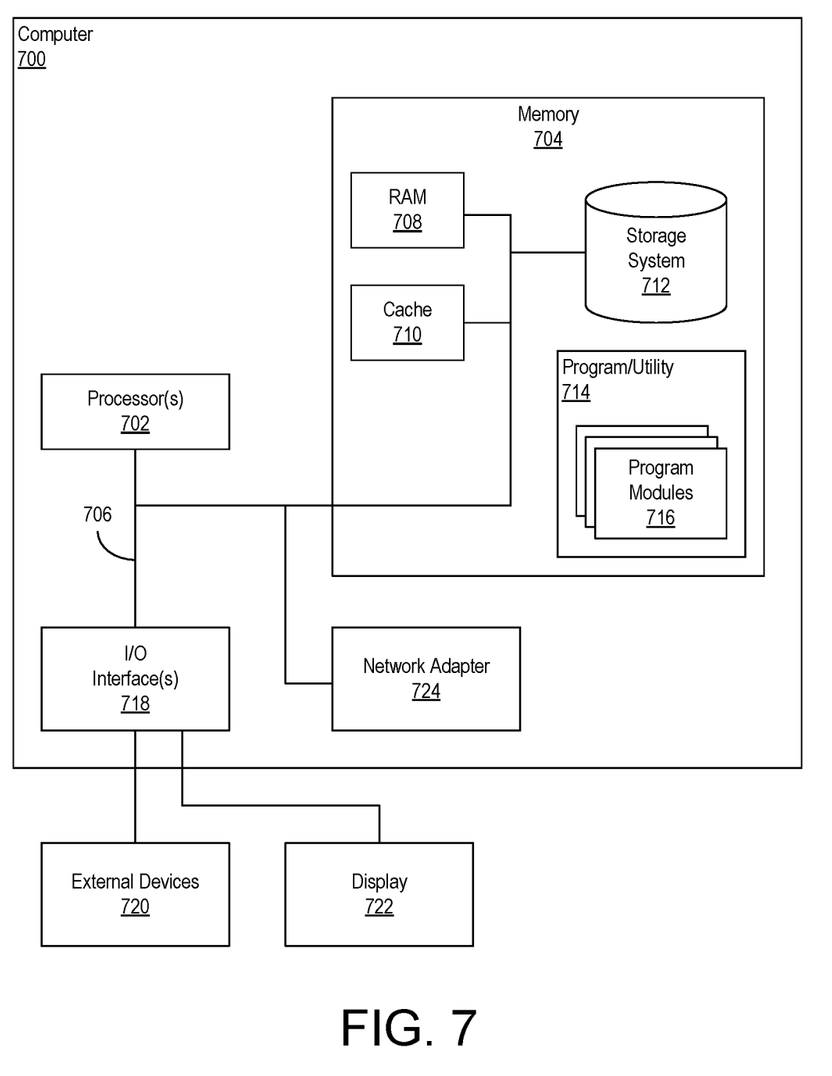
FIG. 7 illustrates an example of a computer for use with the inventive arrangements described herein.

FIG. 7 illustrates an example of a computer 700. Computer 700 is only one example implementation of a computer. Computer 700 may be used in a standalone capacity, e.g., as a user computing device or a server, as part of a computing cluster (e.g., two or more interconnected computers), or as a cloud computing node. The example of FIG. 7 is not intended to suggest any limitation as to the scope of use or functionality of example implementations described herein. Computer 700 is an example of a system and/or computer hardware that is capable of performing the various operations described within this disclosure. Computer 700, for example, is capable of executing an EDA system as described herein.

Computer 700 may be operational with numerous other general purpose or special purpose computing system environments or configurations. Examples of computing systems, environments, and/or configurations that may be suitable for use with computer 700 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer 700 can be described in the general context of computer system-executable instructions, such as program modules, that are executable by a computer system. Generally, program modules can include routines, programs, objects, components, logic, data structures, and so on that perform particular tasks or implement particular abstract data types. Computer 700 can be practiced as a standalone computer system such as a server or in distributed cloud computing environments where tasks are performed by remote processing devices that are linked through a communications network. In a distributed cloud computing environment, program modules may be located in both local and remote computer system storage media including memory storage devices.

As shown in FIG. 7, the components of computer 700 can include, but are not limited to, a processor 702, a memory 704, and a bus 706 that couples various system components including memory 704 to processor 702. Processor 702 may be implemented as one or more processors.

Bus 706 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, and PCI Express (PCIe) bus.

Computer 700 typically includes a variety of computer system readable media. Such media may include computer-readable volatile and non-volatile media and computer readable removable and non-removable media.

Memory 704 can include computer readable media in the form of volatile memory, such as random-access memory (RAM) 708 and/or cache memory 710. Computer 700 can also include other removable/non-removable, volatile/non-volatile computer storage media. By way of example, storage system 712 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 706 by one or more data media interfaces. Memory 704 is an example of at least one computer program product having a set (e.g., at least one) of program modules that are configured to carry out the functions of embodiments of the invention.

Program/utility 714, having a set (at least one) of program modules 716, may be stored in memory 704. By way of example, program modules 716 may represent an operating system, one or more application programs, other program modules, and program data. Program modules 716 generally carry out the functions and/or methodologies of the example implementations described within this disclosure. For example, one or more of the program modules can implement an EDA system and perform the various operations described within this disclosure relating to the system and/or the hardware manager.

Program/utility 714 is executable by processor 702. Program/utility 714 and any data items used, generated, and/or operated upon by computer 700 are functional data structures that impart functionality when employed by computer 700. As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Computer 700 may also communicate with one or more external devices 720 such as a keyboard, a pointing device, a display 722, etc.; one or more devices that enable a user to interact with computer 700; and/or any devices (e.g., network card, modem, etc.) that enable computer 700 to communicate with one or more other computing devices. Such communication can occur via input/output (I/O) interfaces 718. Still, computer 700 can communicate with one or more networks such as a local area network (LAN), a general wide area network (WAN), and/or a public network (e.g., the Internet) via a network adapter 724. As depicted, network adapter 724 communicates with the other components of computer 700 via bus 706. It should be understood that although not shown, other hardware and/or software components could be used in conjunction with computer 700. Examples, include, but are not limited to: microcode, device drivers, redundant processing units, external disk drive arrays, RAID systems, tape drives, and data archival storage systems, etc.

Computer 700 is an example of a data processing system. As defined herein, "data processing system" means one or more hardware systems configured to process data, each hardware system including at least one processor programmed to initiate operations and memory.

Computer 700 may include fewer components than shown or additional components not illustrated in FIG. 7 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

Figure 8:
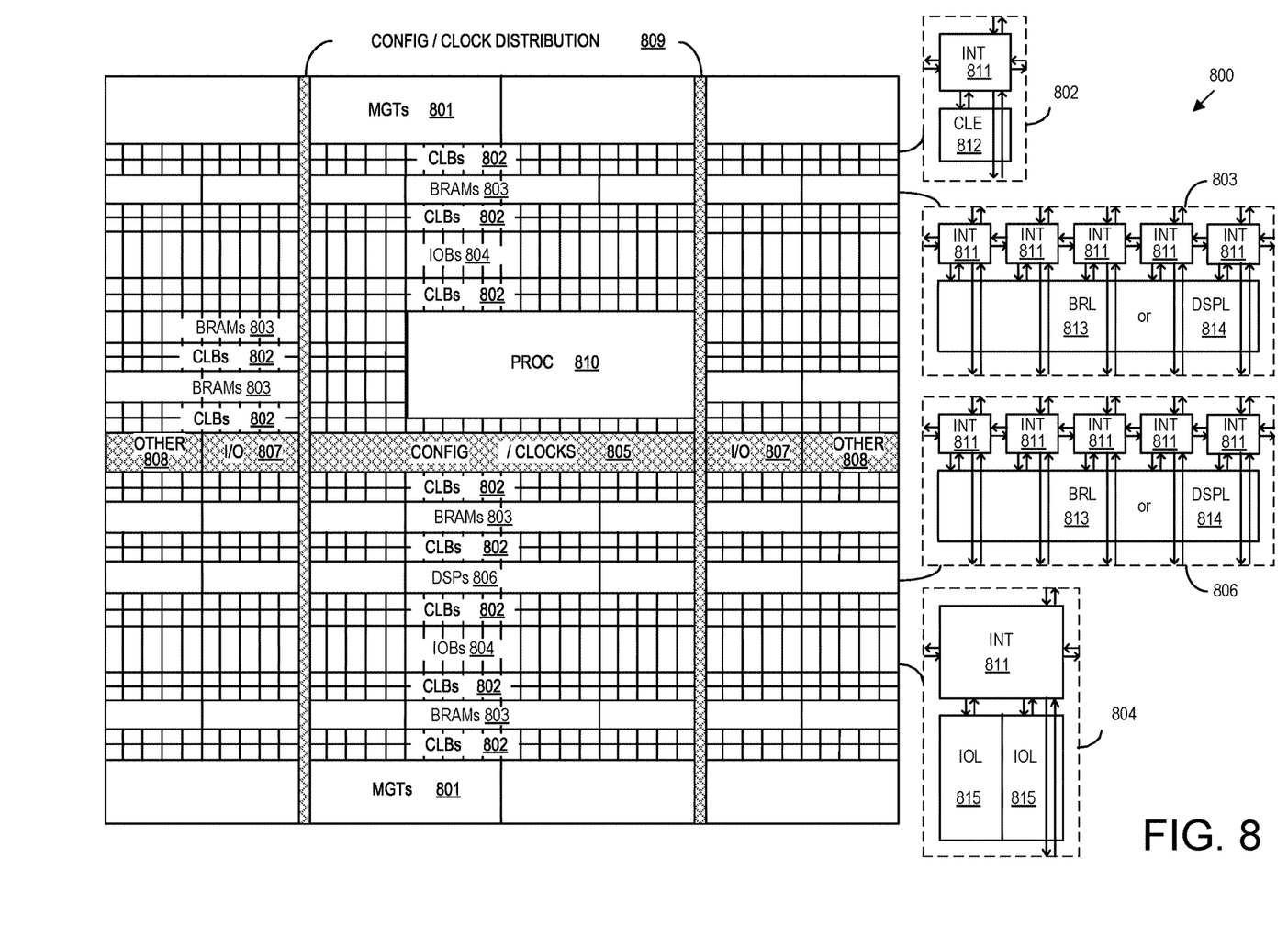
FIG. 8 illustrates an example architecture for an IC.

FIG. 8 illustrates an example architecture 800 for an IC. In one aspect, architecture 800 may be implemented within a programmable IC. For example, architecture 800 may be used to implement a field programmable gate array (FPGA). Architecture 800 may also be representative of a system-on-chip (SoC) type of IC. An SoC is an IC that includes a processor that executes program code and one or more other circuits. The other circuits may be implemented as hard-wired circuitry, programmable circuitry, and/or a combination thereof. The circuits may operate cooperatively with one another and/or with the processor.

As shown, architecture 800 includes several different types of programmable circuit, e.g., logic, blocks. For example, architecture 800 may include a large number of different programmable tiles including multi-gigabit transceivers (MGTs) 801, configurable logic blocks (CLBs) 802, random access memory blocks (BRAMs) 803, input/output blocks (IOBs) 804, configuration and clocking logic (CONFIG/CLOCKS) 805, digital signal processing blocks (DSPs) 806, specialized I/O blocks 807 (e.g., configuration ports and clock ports), and other programmable logic 808 such as digital clock managers, analog-to-digital converters, system monitoring logic, and so forth.

In some ICs, each programmable tile includes a programmable interconnect element (INT) 811 having standardized connections to and from a corresponding INT 811 in each adjacent tile. Therefore, INTs 811, taken together, implement the programmable interconnect structure for the illustrated IC. Each INT 811 also includes the connections to and from the programmable logic element within the same tile, as shown by the examples included at the right of FIG. 8.

For example, a CLB 802 may include a configurable logic element (CLE) 812 that may be programmed to implement user logic plus a single INT 811. A BRAM 803 may include a BRAM logic element (BRL) 813 in addition to one or more INTs 811. Typically, the number of INTs 811 included in a tile depends on the height of the tile. As pictured, a BRAM tile has the same height as five CLBs, but other numbers (e.g., four) also may be used. A DSP tile 806 may include a DSP logic element (DSPL) 814 in addition to an appropriate number of INTs 811. An IOB 804 may include, for example, two instances of an I/O logic element (IOL) 815 in addition to one instance of an INT 811. The actual I/O pads connected to IOL 815 may not be confined to the area of IOL 815.

In the example pictured in FIG. 8, an area near the center of the die, e.g., formed of regions 805, 807, and 808, may be used for configuration, clock, and other control logic. Areas 809 extending from the central area may be used to distribute the clocks and configuration signals across the breadth of the programmable IC.

Some ICs utilizing the architecture illustrated in FIG. 8 include additional logic blocks that disrupt the regular columnar structure making up a large part of the IC. The additional logic blocks may be programmable blocks and/or dedicated circuitry. For example, a processor block depicted as PROC 810 spans several columns of CLBs and BRAMs.

In one aspect, PROC 810 may be implemented as dedicated circuitry, e.g., as a hardwired processor, that is fabricated as part of the die that implements the programmable circuitry of the IC. PROC 810 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 810 may be omitted from architecture 800 and replaced with one or more of the other varieties of the programmable blocks described. Further, such blocks may be utilized to form a "soft processor" in that the various blocks of programmable circuitry may be used to form a processor that can execute program code as is the case with PROC 810.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 8 that are external to PROC 810 such as CLBs 802 and BRAMs 803 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 810.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 810 or a soft processor. In some cases, architecture 800 includes a dedicated configuration processor that loads the configuration bitstream to the appropriate configuration memory and/or processor memory. The dedicated configuration processor does not execute user-specified program code. In other cases, architecture 800 may utilize PROC 810 to receive the configuration bitstream, load the configuration bitstream into appropriate configuration memory, and/or extract program code for execution.

FIG. 8 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the right of FIG. 8 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 810 within the IC are for purposes of illustration only and are not intended as limitations.

A system as described herein in connection with FIG. 1, for example, is capable of processing a circuit design as described herein for implementation within an IC having an architecture the same as or similar to that of FIG. 8. The system, for example, is capable of synthesizing, placing, and routing the circuit design. The system may also perform bitstream generation so that the bitstream may be loaded into the IC, thereby physically implementing the circuit design within the IC. The circuit design, having been instrumented, may be implemented in programmable circuitry of the IC or in a combination of programmable circuitry and hardwired circuitry of the IC.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "processor" means at least one circuit capable of carrying out instructions contained in program code. The circuit may be an integrated circuit or embedded in an integrated circuit.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method can include modifying a circuit design to include a profiler circuit for a RAM of the circuit design, wherein the profiler circuit is configured to monitor an address bus of the RAM, and modifying the circuit design to include a debug circuit connected to the profiler circuit. The method can include generating usage data for the RAM by detecting, using the profiler circuit, addresses of the RAM accessed during a test of the circuit design, as implemented in an IC. The method also can include outputting, using the debug circuit, the usage data for the RAM.

The foregoing and other implementations can each optionally include one or more of the following features, alone or in combination. Some example implementations include all the following features in combination.

In another aspect, the usage data includes a largest address of the RAM accessed during the test.

In another aspect, the profiler circuit includes a comparator coupled to a register, wherein the comparator is configured to determine the largest address of the RAM accessed during the test by storing, in the register, each address from the address bus that exceeds a value previously stored in the register.

In another aspect, the usage data specifies a count of unique addresses of the RAM accessed during the test.

In another aspect, the profiler circuit includes an access detect array having one bit mapped to each unique address of the RAM, wherein in response to detecting addresses on the address bus during the test, bits corresponding to the addresses are set in the access detect array.

In another aspect, the access detect array has a same depth as the RAM and a width of 1-bit.

In another aspect, the profiler circuit includes read logic configured to generate the count based on data read from the access detect array.

In another aspect, the addresses of the RAM accessed during the test include addresses that are read and written.

In another aspect, the method includes receiving the usage data via a computer coupled to the IC and generating a report, using the computer, based on the usage data. The method also can include providing the report via a user interface of the computer.

In another aspect, the report indicates a number of memory primitives needed to implement the RAM based on an amount of the RAM accessed and a size of the memory primitives.

In another aspect, the report indicates at least one of a largest address of the RAM accessed during the test or a number of unique addresses of the RAM accessed during the test.

In another aspect, the debug circuit reads the usage data from the profiler circuit subsequent to the test.

An IC can include a random-access memory (RAM) having an address bus and a profiler circuit coupled to the address bus of the RAM. The profiler circuit is configured to monitor the address bus and generate usage data for the RAM based on addresses detected on the address bus during a test of a circuit design including the RAM as implemented within the IC. The IC also can include a debug circuit coupled to the profiler circuit, wherein the debug circuit is configured to output the usage data for the RAM.

The foregoing and other implementations can each optionally include one or more of the following features, alone or in combination. Some example implementations include all the following features in combination.

In another aspect, the usage data includes a largest address of the RAM accessed during the test.

In another aspect, the profiler circuit includes a comparator coupled to a register, wherein the comparator is configured to determine the largest address of the RAM accessed during the test by storing each address from the address bus that exceeds a value previously stored in the register.

In another aspect, the usage data specifies a count of unique addresses of the RAM accessed during the test.

In another aspect, the profiler circuit includes an access detect array having one bit mapped to each unique address of the RAM, wherein in response to detecting addresses on the address bus during the test, bits corresponding to the addresses are set in the access detect array.

In another aspect, the access detect array has a same depth as the RAM and a width of 1-bit.

In another aspect, the profiler circuit includes read logic configured to generate the count based on data read from the access detect array.

The description of the inventive arrangements provided herein is for purposes of illustration and is not intended to be exhaustive or limited to the form and examples disclosed.

The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
    modifying a circuit design to include a profiler circuit for a random-access memory (RAM) of the circuit design; wherein the profiler circuit is configured to monitor an address bus of the RAM;
    modifying the circuit design to include a debug circuit connected to the profiler circuit;
    generating usage data for the RAM by detecting, using the profiler circuit, addresses of the RAM accessed during a test of the circuit design, as implemented in an integrated circuit; and
    outputting, using the debug circuit, the usage data for the RAM.

2. The method of claim 1, wherein the usage data comprises a largest address of the RAM accessed during the test.

3. The method of claim 2, wherein the profiler circuit comprises:
    a comparator coupled to a register, wherein the comparator is configured to determine the largest address of the RAM accessed during the test by storing, in the register, each address from the address bus that exceeds a value previously stored in the register.

4. The method of claim 1, wherein the usage data comprises a count of unique addresses of the RAM accessed during the test.

5. The method of claim 4, wherein the profiler circuit comprises:
    an access detect array having one bit mapped to each unique address of the RAM, wherein in response to detecting addresses on the address bus during the test, bits corresponding to the addresses are set in the access detect array.

6. The method of claim 5, wherein the access detect array has a same depth as the RAM and a width of 1-bit.

7. The method of claim 5, wherein the profiler circuit comprises:
    read logic configured to generate the count based on data read from the access detect array.

8. The method of claim 1, wherein the addresses of the RAM accessed during the test include addresses that are read and written.

9. The method of claim 1, further comprising:
    receiving the usage data via a computer coupled to the integrated circuit; and
    generating a report, using the computer, based on the usage data.

10. The method of claim 9, further comprising:
    providing the report via a user interface of the computer.

11. The method of claim 9, wherein the report indicates a number of memory primitives needed to implement the RAM based on an amount of the RAM accessed and a size of the memory primitives.

12. The method of claim 9, wherein the report indicates at least one of a largest address of the RAM accessed during the test or a number of unique addresses of the RAM accessed during the test.

13. The method of claim 1, wherein the debug circuit reads the usage data from the profiler circuit subsequent to the test.

14. An integrated circuit, comprising:
    a random-access memory (RAM) having an address bus;
    a profiler circuit coupled to the address bus of the RAM, wherein the profiler circuit is configured to monitor the address bus and generate usage data for the RAM based on addresses detected on the address bus during a test of a circuit design including the RAM as implemented within the integrated circuit; and
    a debug circuit coupled to the profiler circuit, wherein the debug circuit is configured to output the usage data for the RAM.

15. The integrated circuit of claim 14, wherein the usage data comprises a largest address of the RAM accessed during the test.

16. The integrated circuit of claim 15, wherein the profiler circuit comprises:
    a comparator coupled to a register, wherein the comparator is configured to determine the largest address of the RAM accessed during the test by storing, in the register, each address from the address bus that exceeds a value previously stored in the register.

17. The integrated circuit of claim 14, wherein the usage data comprises a count of unique addresses of the RAM accessed during the test.

18. The integrated circuit of claim 17, wherein the profiler circuit comprises:
    an access detect array having one bit mapped to each unique address of the RAM, wherein in response to detecting addresses on the address bus during the test, bits corresponding to the addresses are set in the access detect array.

19. The integrated circuit of claim 18, wherein the access detect array has a same depth as the RAM and a width of 1-bit.

20. The integrated circuit of claim 18, wherein the profiler circuit comprises:
    read logic configured to generate the count based on data read from the access detect array.

* * * * *